(12) United States Patent
Terashima et al.

(10) Patent No.: US 11,380,547 B2
(45) Date of Patent: Jul. 5, 2022

(54) PLASMA PROCESSING METHOD AND PLASMA PROCESSING APPARATUS

(71) Applicant: Tokyo Electron Limited, Tokyo (JP)

(72) Inventors: Ryo Terashima, Miyagi (JP); Yuzuru Sakai, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/084,792

(22) Filed: Oct. 30, 2020

(65) Prior Publication Data

US 2021/0134596 A1    May 6, 2021

(30) Foreign Application Priority Data

Nov. 6, 2019 (JP) .............................. JP2019-201668

(51) Int. Cl.

| | |
|---|---|
| *H01L 21/033* | (2006.01) |
| *H01L 21/311* | (2006.01) |
| *H01J 37/32* | (2006.01) |
| *H01L 21/3213* | (2006.01) |

(52) U.S. Cl.
CPC .... *H01L 21/0337* (2013.01); *H01J 37/32449* (2013.01); *H01L 21/31138* (2013.01); *H01L 21/31144* (2013.01); *H01L 21/32137* (2013.01); *H01J 2237/3341* (2013.01)

(58) Field of Classification Search
None
See application file for complete search history.

(56) References Cited

U.S. PATENT DOCUMENTS

| | | | | |
|---|---|---|---|---|
| 2005/0003653 A1* | 1/2005 | Kanamura | ........ | H01L 21/76835 |
| | | | | 438/622 |
| 2007/0082483 A1* | 4/2007 | Bai | ................... | H01L 21/02063 |
| | | | | 438/637 |

FOREIGN PATENT DOCUMENTS

JP        2010-109373        5/2010

* cited by examiner

*Primary Examiner* — Jiong-Ping Lu
(74) *Attorney, Agent, or Firm* — IPUSA, PLLC (57) ABSTRACT

A plasma processing method of etching an organic film through a mask having an opening is provided. The mask is formed on the organic film, and is made of a silicon-containing film. The method includes rectifying a shape of the mask. The rectifying of the shape of the mask includes refining a side wall of the opening of the mask, and etching an upper surface of the mask.

19 Claims, 6 Drawing Sheets

PLASMA PROCESSING METHOD AND PLASMA PROCESSING APPARATUS

CROSS-REFERENCE TO RELATED APPLICATIONS

This patent application is based on and claims priority to Japanese Patent Application No. 2019-201668 filed on Nov. 6, 2019, the entire contents of which are incorporated herein by reference.

TECHNICAL FIELD

The present disclosure relates to a plasma processing method and a plasma processing apparatus.

BACKGROUND

For example, in an etching process of a 3D NAND device, an organic film, such as an amorphous carbon film, is used as a mask for etching layered films of $SiO_x$ film and SiN film. A pattern is formed in the mask of the organic film by etching the organic film using an inorganic film such as SiON film as a mask.

Patent Document 1 describes a method for controlling critical dimension (CD) of an etch feature in an etch layer disposed below a functionalized organic mask layer disposed below an intermediate mask layer disposed below a resist mask, by forming a plasma of an open gas containing COS in an opening of the functionalized organic mask layer.

RELATED ART DOCUMENT

Patent Document

[Patent Document 1] Japanese Laid-open Patent Application Publication No. 2010-109373

SUMMARY

In one aspect, the present disclosure provides a plasma processing method and a plasma processing apparatus for suppressing etching profile defects of organic films.

In order to solve the above problem, according to one aspect, a plasma processing method of etching an organic film through a mask having an opening is provided. The mask is formed on the organic film, and is made of a silicon-containing film. The method includes rectifying a shape of the mask. The rectifying of the shape of the mask includes refining a side wall of the opening of the mask, and etching an upper surface of the mask.

DETAILED DESCRIPTION OF EMBODIMENTS

In the following, embodiments for carrying out the present disclosure will be described with reference to the drawings. In each drawing, elements having identical features are given the same reference symbols and overlapping descriptions may be omitted.

Figure 1:
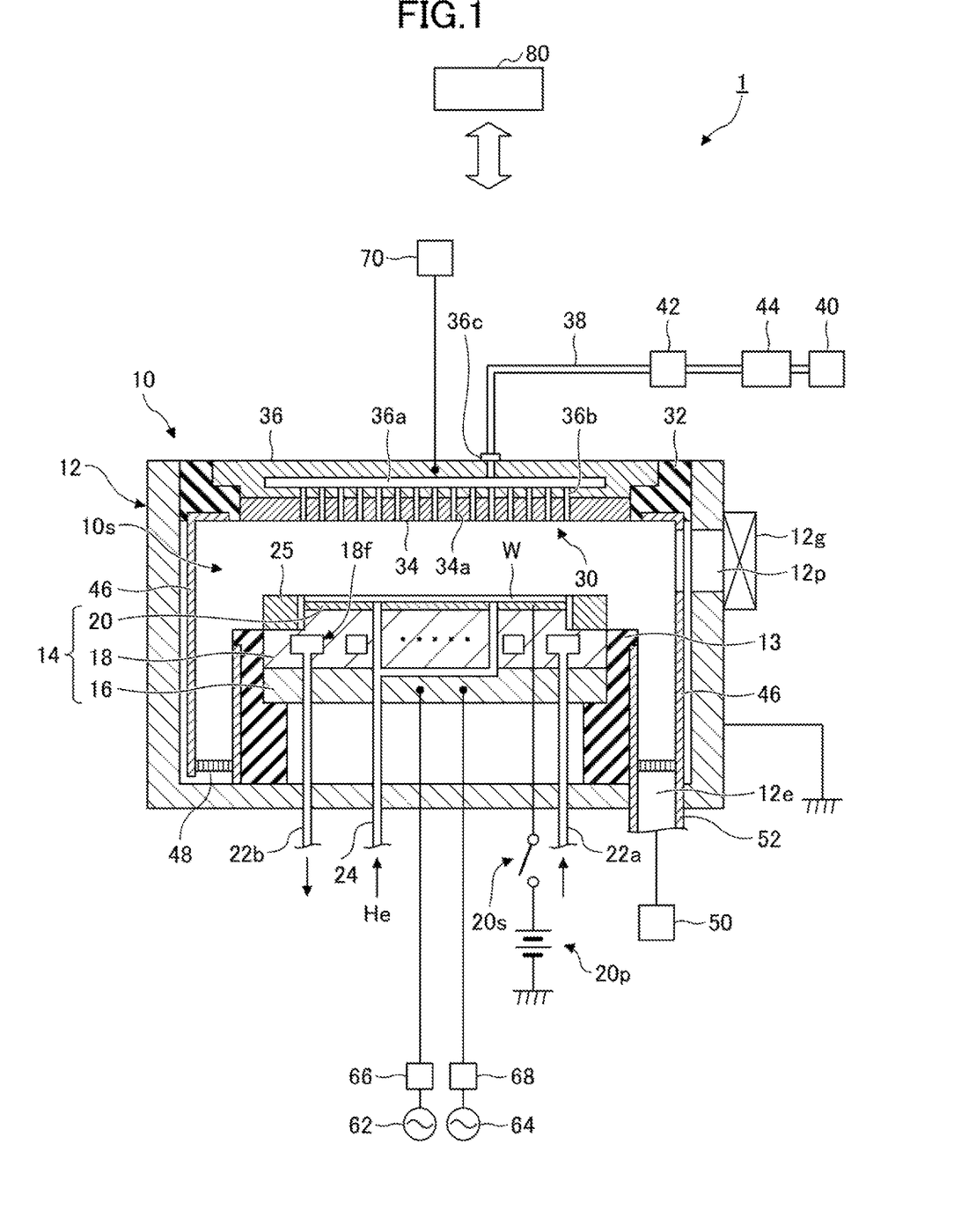
FIG. 1 is a cross-sectional view illustrating an example of a plasma processing apparatus according to an embodiment.

A substrate processing apparatus 1 (may also be referred to as a "plasma processing apparatus 1") according to an embodiment will be described with reference to FIG. 1. FIG. 1 is a cross-sectional view illustrating an example of the substrate processing apparatus 1 according to the present embodiment.

The substrate processing apparatus 1 includes a chamber 10. The chamber 10 provides an interior space 10s therein. The chamber 10 includes a chamber body 12. The chamber body 12 is generally cylindrical in shape. The chamber body 12 is formed of, for example, aluminum. A corrosion resistant film is provided on the inner wall of the chamber body 12. The film may be formed of ceramic such as aluminum oxide and yttrium oxide.

A passage 12p is formed in the side wall of the chamber body 12. A substrate W is transferred between the interior space 10s and the exterior of the chamber 10 through the passage 12p. The passage 12p is opened and closed by a gate valve 12g provided along the side wall of the chamber body 12.

A support 13 is provided on the bottom of the chamber body 12. The support 13 is formed of an insulating material. The support 13 is generally cylindrical in shape. The support 13 extends upward from the bottom of the chamber body 12 in the interior space 10s. At the upper portion of the support 13, a support platform (stage) 14 is provided. The support platform 14 is configured to support the substrate W in the interior space 10s.

The support platform 14 includes a lower electrode 18 and an electrostatic chuck 20. The support platform 14 may further include an electrode plate 16. The electrode plate 16 is formed of a conductor such as aluminum, and is generally disc-shaped. The lower electrode 18 is disposed on the electrode plate 16. The lower electrode 18 is formed of a conductor such as aluminum, and is generally disc-shaped. The lower electrode 18 is electrically connected to the electrode plate 16.

The electrostatic chuck 20 is provided on the lower electrode 18. A substrate W is placed on the upper surface of the electrostatic chuck 20. The electrostatic chuck 20 includes a body and an electrode. The body of the electrostatic chuck 20 is generally disc-shaped, and is formed of a dielectric material. The electrode of the electrostatic chuck 20 is a film-like electrode provided within the body of the electrostatic chuck 20. The electrode of the electrostatic chuck 20 is connected to a direct-current (DC) power supply 20p via a switch 20s. When voltage from the DC power supply 20p is applied to the electrode of the electrostatic chuck 20, electrostatic attractive force is generated between the electrostatic chuck 20 and the substrate W. By the electrostatic attractive force, the substrate W is held by the electrostatic chuck 20.

An edge ring 25 is disposed on a periphery of the lower electrode 18 to surround the edge of the substrate W. The edge ring 25 improves in-plane uniformity of plasma processing applied to the substrate W. The edge ring 25 may be formed of silicon, silicon carbide, quartz, or the like.

A flow passage 18f is provided within the lower electrode 18. A heat exchange medium (e.g., refrigerant) is supplied to the flow passage 18f from a chiller unit (not illustrated)

provided outside the chamber 10 through a pipe 22a. The heat exchange medium supplied to the flow passage 18f is returned to the chiller unit via a pipe 22b. In the substrate processing apparatus 1, the temperature of the substrate W placed on the electrostatic chuck 20 is adjusted by heat exchange between the heat exchange medium and the lower electrode 18.

The substrate processing apparatus 1 is provided with a gas supply line 24. The gas supply line 24 supplies a heat transfer gas (e.g., He gas) from a heat transfer gas supply mechanism to a gap between the upper surface of the electrostatic chuck 20 and the bottom surface of the substrate w.

The substrate processing apparatus 1 further includes an upper electrode 30. The upper electrode 30 is provided above the support platform 14. The upper electrode 30 is supported on the top of the chamber body 12 via a member 32. The member 32 is formed of an insulating material. The upper electrode 30 and the member 32 occlude the top opening of the chamber body 12.

The upper electrode 30 may include a top plate 34 and a support 36. The lower surface of the top plate 34 is exposed to the interior space 10s, and defines the interior space 10s. The top plate 34 may be formed of a low resistance conductor or semiconductor with low Joule heat generation. The top plate 34 has multiple gas discharge holes 34a penetrating the top plate 34 in a thickness direction of the top plate 34.

The support 36 removably supports the top plate 34. The support 36 is formed of an electrically conductive material such as aluminum. Inside the support 36, a gas diffusion chamber 36a is provided. The support 36 has multiple gas holes 36b extending downward from the gas diffusion chamber 36a. The multiple gas holes 36b communicate with the multiple gas discharge holes 34a, respectively. A gas inlet 36c is formed in the support 36. The gas inlet 36c is connected to the gas diffusion chamber 36a. A gas supply line 33 is connected to the gas inlet 36c.

Valves 42, flow controllers 44, and gas sources 40 are connected to the gas supply line 38. The gas sources 40, the valves 42, and the flow controllers 44 constitute a gas supply section. Each of the valves 42 may be an open/close valve. Each of the flow controllers 44 is a mass flow controller or a pressure-controlled flow controller. Each of the gas sources 40 is connected to the gas supply line 38 via a corresponding open/close valve of the valves 42 and a corresponding flow controller of the flow controllers 44.

In the substrate processing apparatus 1, a shield 46 is removably provided along the inner wall surface of the chamber body 12 and the outer circumference of the support 13. The shield 46 prevents reaction by-products from adhering to the chamber body 12. The shield 46 is constructed by, for example, forming a corrosion resistant film on the surface of a member formed of aluminum. The corrosion resistant film may be formed of ceramic such as yttrium oxide.

A baffle plate 48 is provided between the outer side wall of the support. 13 and the inner side wall of the chamber body 12. The baffle plate 43 is constructed by, for example, forming a corrosion-resistant film (a film such as yttrium oxide) on the surface of a member formed from aluminum. Multiple through-holes are formed in the baffle plate 43. An exhaust port 12e is provided below the baffle plate 48, at the bottom of the chamber body 12. An exhaust device 50 is connected to the exhaust port 12e via an exhaust pipe 52. The exhaust device 50 includes a pressure regulating valve and a vacuum pump such as a turbomolecular pump.

The substrate processing apparatus 1 includes a first radio frequency power supply 62 and a second radio frequency power supply 64. The first radio frequency power supply 62 is a power source that generates first radio frequency power. The first radio frequency power has a frequency suitable for generating a plasma. The frequency of the first radio frequency power is, for example, a frequency in the range of 27 MHz to 100 MHz. The first radio frequency power supply 62 is connected to the lower electrode 18 via a matcher 66 and the electrode plate 16. The matcher 66 includes circuitry for causing the output impedance of the first radio frequency power supply 62 to match impedance of the load side (lower electrode 18 side). The first radio frequency power supply 62 may be connected to the upper electrode 30 via the matcher 66.

The second radio frequency power supply 64 is a power source that generates second radio frequency power. The second radio frequency power has a frequency lower than the frequency of the first radio frequency power. In a case in which the second radio frequency power is used in conjunction with the first radio frequency power, the second radio frequency power is used as radio frequency power for biasing to draw ions into the substrate W. The frequency of the second radio frequency power is, for example, a frequency in the range of 400 kHz to 13.56 MHz. The second radio frequency power supply 64 is connected to the lower electrode 18 via a matcher 68 and the electrode plate 16. The matcher 68 includes circuitry for causing the output impedance of the second radio frequency power supply 64 to match impedance of the load side (lower electrode 18 side).

It should be noted that a plasma may be generated using the second radio frequency power, without using the first radio frequency power. That is, a plasma may be generated using only single radio frequency power. In such a case, the frequency of the second radio frequency power may be greater than 13.56 MHz, for example 40 MHz. In this case, the substrate processing apparatus 1 may not include the first radio frequency power supply 62 and the matcher 66. The first radio frequency power supply 62, the second radio frequency power supply 64, the upper electrode 30, and the lower electrode 18 constitute an example plasma generator.

In the substrate processing apparatus 1, gas is supplied from the gas supply section to the interior space 10s to produce a plasma. Also, as the first radio frequency power and/or the second radio frequency power are supplied, a radio frequency electric field is generated between the upper electrode 30 and the lower electrode 18. The generated radio frequency electric field generates a plasma.

The substrate processing apparatus 1 includes a power supply 70. The power supply 70 is connected to the upper electrode 30. The power supply 70 applies voltage to the upper electrode 30 to draw positive ions that are present in the interior space 10s into the top plate 34.

The substrate processing apparatus 1 may further include a controller 30. The controller 80 may be a computer including a processor, a storage device such as a memory, an input device, a display device, an input/output interface of a signal, or the like. The controller 30 controls each part of the substrate processing apparatus 1. An operator can perform input operations of commands to manage the substrate processing apparatus 1, by using the input device of the controller 80. The controller 80 can also display an operation status of the substrate processing apparatus 1 on the display device. Further, a control program and recipe data are stored in the storage device. The control program is executed by the processor to cause the substrate processing apparatus 1 to perform various processes. The processor executes the control program, and controls each part of the substrate processing apparatus 1 in accordance with the recipe data.

Figure 2:
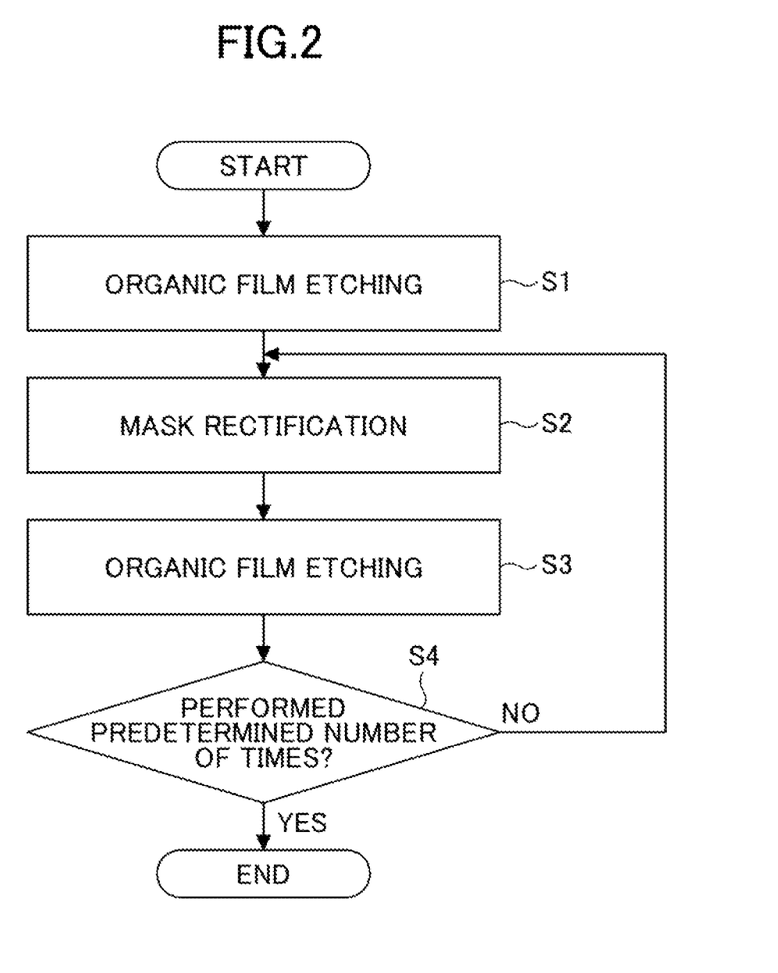
FIG. 2 is a flowchart illustrating an example of a process of etching an organic film using an inorganic film as a mask.
Figure 3:
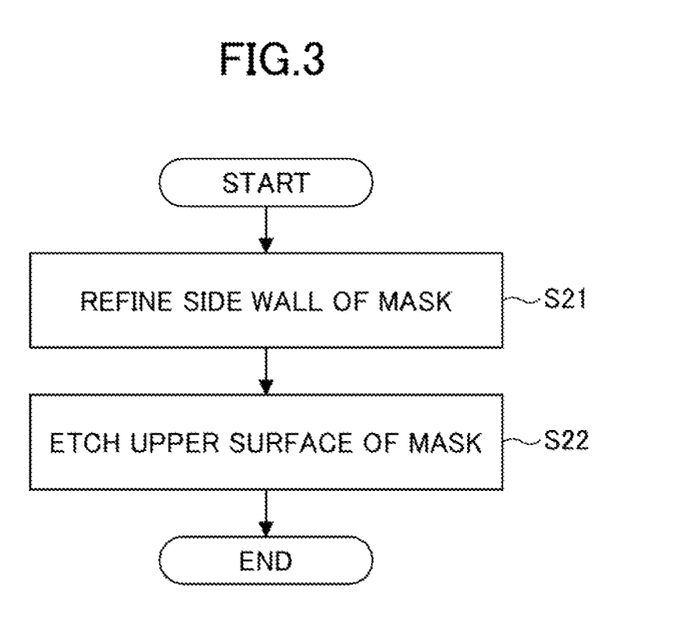
FIG. 3 is a flow chart illustrating a process in a mask rectification step.

Next, a plasma processing method (substrate processing method) performed in the substrate processing apparatus 1 will be described with reference to FIGS. 2 to 4E. FIGS. 2 and 3 are flowcharts illustrating an example of a process of etching an organic film 110 in the substrate W by a plasma, using a silicon-containing film 120 as a mask. FIGS. 4A to 4E are schematic diagrams each illustrating the structure of the substrate W.

Figure 4A:
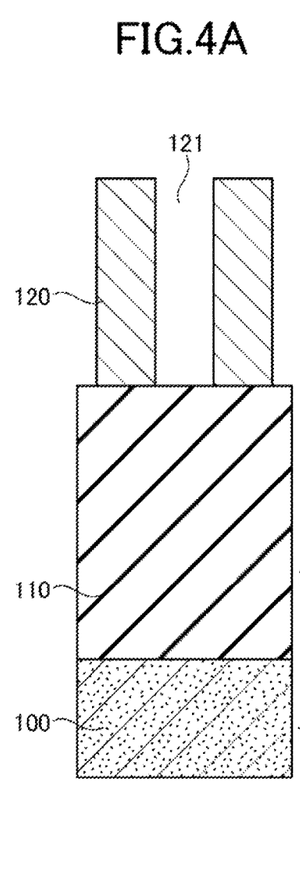
FIGS. 4A to 4S are schematic diagrams each illustrating the structure of a substrate W.

FIG. 4A illustrates the structure of the substrate W before an etching process is started. The substrate W includes a underlayer film 100, the organic film 110, and the silicon-containing film 120.

The silicon-containing film 120 has a pattern of an opening 121 such as a hole or a trench, and is used as the mask when etching the organic film 110. In the following description, the silicon-containing film 120 is a film containing at least Si—O. Also, in the following description, a case in which the silicon-containing film 120 is an SiON film will be described. However, the silicon-containing film 120 is not limited to the SiON film, and may be an $SiO_2$ film, an SiARC, or the like.

The organic film 110 is provided beneath the silicon-containing film 120. The organic film 110 is etched by an etching process illustrated in FIG. 2, which will be described below, by using the silicon-containing film 120 having the pattern of the opening 121 as the mask, to form a pattern of an opening 111. The organic film 110, in which the pattern of the opening 111 (see FIG. 4E to be described below) is formed, is used as a mask when etching the underlayer film 100. In the following description, the organic film 110 will be described as being an amorphous carbon film. The organic film 110 is not limited to an amorphous carbon film. The organic film 110 may be a spin-on carbon (SOC) film, a doped carbon film, a CF film (fluorine incorporated carbon film), a low-permittivity organic film, or the like, in which carbon (C) atoms are the main component. The organic film 110 may be a multilayered film formed from multiple types of organic films.

The underlayer film 100 is provided beneath the organic film 110. The underlayer film 100 is etched by using the organic film 110 as a mask, in which the pattern of the opening 111 is formed by the etching process of the organic film 110 illustrated in FIG. 2. The underlayer film 100 may be, for example, a multilayered film of $SiO_x$ and SiN films. However, the underlayer film 100 is not limited thereto.

Prior to the start of the etching process illustrated in FIG. 2, the substrate W is loaded into the interior space 10s of the chamber 10 via the passage 12p, and is placed on the support platform 14. The controller 80 controls the switch 20s to cause the substrate W to be attracted to the electrostatic chuck 20. Then, the controller 80 closes the gate valve 12g. The controller 80 also controls the exhaust device 50 to set the interior space 10s to be a desired pressure. Further, the temperature of the substrate W is adjusted to a desired temperature by supplying a heat transfer gas from the gas supply line 24 and by supplying a heat exchange medium from the chiller unit (not illustrated) into the flow passage 18f.

In step S1 of FIG. 2, the organic film 110 is etched using the silicon-containing film 120 as a mask (organic film etching). Specifically, the controller 80 controls the gas sources 40, the valves 42, and the flow controllers 44 to supply an etching gas (fourth process gas) from the gas holes 38b to the interior space 10s. As the etching gas, $O_2$ gas may be used. The etching gas is not limited to $O_2$ gas. The etching gas may be CO gas, $CO_2$ gas, $O_3$ gas, or a mixed gas of these gases. In addition, at least one of COS gas, $Cl_2$ gas, and HBr gas may be added. The controller 80 also controls the first radio frequency power supply 62 to apply the first radio frequency power to the lower electrode 18 for generating a plasma. The controller 80 also controls the second radio frequency power supply 64 to apply the second radio frequency power to the lower electrode 18 for drawing ions to the substrate W.

An example of suitable parameters in step S1 is illustrated below.

Pressure: 10 to 50 mTorr
First radio frequency power: 1000 to 5000 W
Second radio frequency power: 50 to 500 W
Substrate temperature: −10 to 20° C.

Figure 4B:
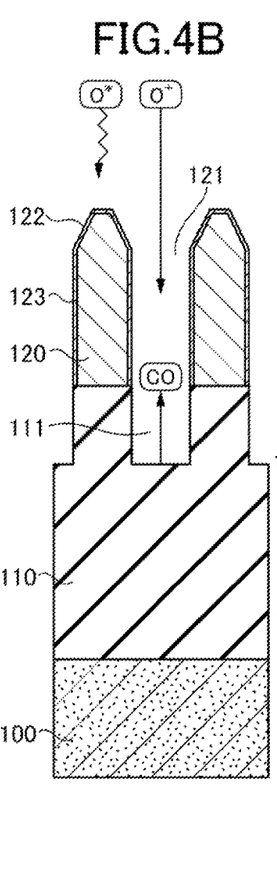

Accordingly, as illustrated in FIG. 4B, the organic film 110 is plasma etched through the silicon-containing film 120 as a mask, by oxygen ions ($O^+$) and oxygen radicals ($O^+$) in the plasma, and the opening 111 is formed in the organic film 110. CO, which is a reaction product when the organic film 110 is plasma etched, is discharged from the interior space 10s by the exhaust device 50.

The silicon-containing film 120 is also etched and abraded by oxygen ions ($O^+$) and oxygen radicals ($O^+$) in the plasma. Here, it is known that the etching yield of the silicon-containing film 120 is dependent on an angle of incidence of ions, and the etching yield becomes highest when the angle of incidence is near a predetermined angle (e.g., around 60° to 75°, though depending on film types or applied voltage). For this reason, in the silicon-containing film 120 in which a pattern having a projection and a recess is formed, there is a difference in etch rate between a shoulder portion (edge of the projection or the opening 121) and a flat portion (upper surface of the projection). Therefore, as illustrated in FIG. 4B, a shoulder of the silicon-containing film 120 wears earlier, and a slope 122 is formed. Also, because of the difference in etch rate between the slope 122 and the flat portion, the slope 122 expands.

The surface of the silicon-containing film 120, which is an SiON film, is oxidized with oxygen ions ($O^+$) and oxygen radicals ($O^+$). Thus, an oxide film 123, which is an $SiO_2$ film, is formed on the surface of the silicon-containing film 120.

In step S2, a shape of the silicon-containing film 120 as a mask is rectified. That Is, the silicon-containing film 120, of which the shoulder has been abraded and the slope 122 has been formed, is rectangulated. Thus, in the present embodiment, step S2 may also be referred to as a "mask rectification step". Specifically, the controller 80 controls the gas sources 40, the valves 42, and the flow controllers 44 to supply a first process gas and a second process gas from the gas holes 36b to the interior space 10s. The controller 80 also controls the first radio frequency power supply 62 to apply the first radio frequency power to the lower electrode 18 for generating a plasma. The controller 80 also controls the second radio frequency power supply 64 to apply the second radio frequency power to the lower electrode 18 for drawing ions to the substrate W.

The first process gas is a hydrogen-containing gas that contains at least hydrogen (H). In the following description, the first process gas is described as being Hr. The first process gas is not limited to $H_2$. The first process gas may be $CH_4$, $CH_3F$, $CH_2F_2$, $H_2O$, or the like. The first process gas may also be a mixed gas of these gases.

The second process gas is a halogen-containing gas that contains at least halogens. Also, the second process gas may be a halogen-containing gas having at least halogens and hydrogen. In the following description, the second process gas is described as being $CF_4$. However, the second process gas is not limited to $CF_4$. The second process gas may be $CHF_3$, $C_4F_8$, $C_4F_6$, $NF_3$, HBr, $Cl_2$, or the like. The second process gas may also be a mixed gas of these gases.

An example of suitable parameters in step S2 is illustrated below.

Pressure: 10 to 50 mTorr
First radio frequency power: 1000 to 2000 W
Second radio frequency power: 50 to 500 W
Gas flow ratio (second process gas/first process gas): 0.11 to 2
Substrate temperature: −10 to 20° C.

The mask rectification step of step S2 will be further described with reference to FIG. 3. FIG. 3 is a flowchart illustrating the process of the mask rectification step.

Figure 4C:
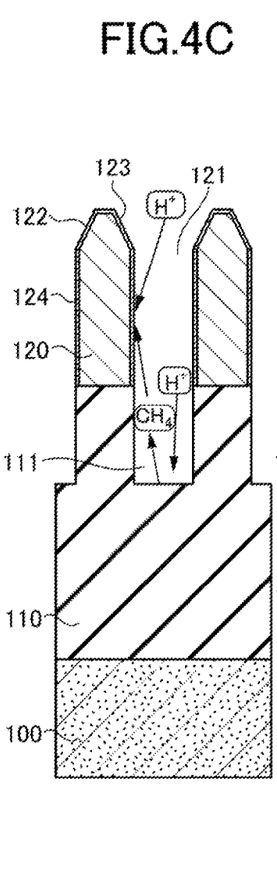

In step S21, the side wall of the opening 121 of the mask (silicon-containing film 120) is refined by using the first process gas. As illustrated in FIG. 4C, the bottom surface of the opening 111 of the organic film 110 is plasma etched using the silicon-containing film 120 as a mask, by hydrogen ions ($H^+$) and hydrogen radicals ($H^*$) generated from the first process gas. At this time, reaction products ($CH_4$, and an intermediate $CH_x$ having a dangling bond) are generated in the opening 111 of the organic film 110 when the organic film 110 is plasma etched by hydrogen, and are adsorbed on the side wall of the opening 121 of the silicon-containing film 120.

Then, at the side wall of the opening 121, as hydrogen ions that promote reduction are supplied from the plasma generated in the interior space 10s, and energy is supplied by radiation of UV from the plasma generated in the interior space 10s, the reaction products ($CH_4$, $CH_x$) adsorbed on the side wall of the opening 121 react with $SiO_2$, which is the oxide film 123 on the surface of the silicon-containing film 120. Or, the reaction products ($CH_4$, $CH_x$) adsorbed on the oxide film 123 on the surface of the silicon-containing film 120 react with SiO; after the reaction products ($CH_4$, $CH_x$) are pyrolyzed. This increases a rate of reduction carbonization in which $SiO_2$ is changed to SiC, which is illustrated in the following chemical formula (1), refines the side wall of the silicon-containing film 120 (oxide film 123) that is $SiO_2$, and forms a refined film 124 of SiC. CO and $H_2O$, which are reaction products generated during refining of $SiO_2$ into SiC, are discharged from the interior space 10s by the exhaust device 50.

$$SiO_2 3C \rightarrow SiC + 2CO \qquad (1)$$

Here, the reaction products ($CH_4$, $CH_x$) are supplied from the opening 111 of the organic film 110 to the side wall of the opening 121 of the silicon-containing film 120. Accordingly, in refining $SiO_2$ into SiC, the side wall of the opening 121 of the silicon-containing film 120 is mainly refined, and refinement of the slope 122 and the upper surface of the silicon-containing film 120 is suppressed.

Figure 4D:
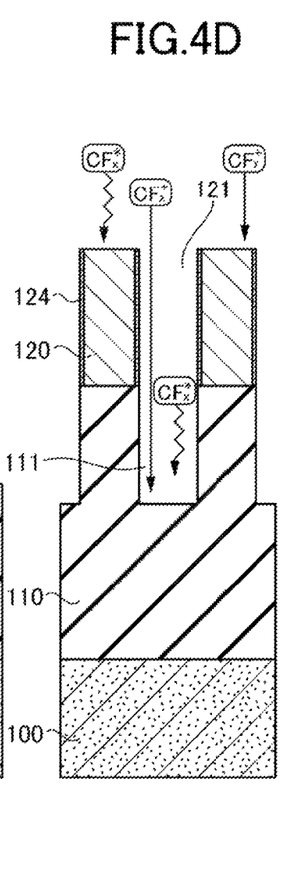

In step S22, the upper surface of the mask (silicon-containing film 120) is plasma etched using the second process gas. As illustrated in FIG. 4D, the bottom surface of the opening 111 of the organic film 110 is plasma etched using the silicon-containing film 120 as a mask by ions (such as $CF_x^+$) and radicals (such as $CF_x^*$) generated from the second process gas. The top surface of the silicon-containing film 120 is plasma etched by ions (such as $CF_z^+$) or radicals (such as $CF_x^*$). In step S22, the recipe is set such that an etch rate of the refined film 124 (SiC) is lower than an etch rate of the silicon-containing film 120 (SiON, and $SiO_2$ which is the oxide film 123 on the upper surface of SiON). That is, the etch rate selectivity of SiON and $SiO_2$ with respect to SiC is increased. That is, by the silicon-containing film 120 being plasma etched using the second process gas while the side wall of the silicon-containing film 120 is protected by the refined film 124 (SiC), the upper surface of the silicon-containing film 120 is etched so as to rectangulate the shoulder of the silicon-containing film 120.

The above description of step S2 has described the case in which the first process gas and the second process gas are simultaneously supplied to refine the side wall of the opening 121 of the mask (the silicon-containing film 120) (step S21) and to plasma etch the upper surface of the mask (the silicon-containing film 120) (step S22) simultaneously. However, the present invention is not limited thereto. After the process (step S21) of supplying the first process gas to refine the side wall of the opening 121 of the mask (silicon-containing film 120) has been performed, the process (step S22) of supplying the second process gas to plasma etch the upper surface of the mask (silicon-containing film 120) may be performed.

Returning to FIG. 2, in step S3, the organic film 110 is etched (organic film etching) using the silicon-containing film 120 whose shoulder is rectangulated as a mask. Specifically, the controller 80 controls the gas sources 40, the valves 42, and the flow controllers 44 to supply an etching gas (third process gas) from the gas holes 36b to the interior space 10s. As the etching gas, $O_2$ gas may be used. The etching gas is not limited to $O_2$ gas. The etching gas may be CO gas, $CO_2$ gas, $O_3$ gas, or a mixed gas of these gases. In addition, at least one of COS gas, $Cl_2$ gas, and HBr gas may be added. Further the controller 80 controls the first radio frequency power supply 62 to apply the first radio frequency power to the lower electrode 18 for generating a plasma. The controller 80 also controls the second radio frequency power supply 64 to apply the second radio frequency power to the lower electrode 18 for drawing ions to the substrate W.

An example of suitable parameters in step S3 is illustrated below.

Pressure: 10 to 50 mTorr
First radio frequency power: 1000 to 5000 W
Second radio frequency power: 50 to 500 W
Substrate temperature: −10 to 20° C.

The process conditions of the organic film etching performed in step S3 may be the same as that of the organic film etching performed in step S1, or may be different. The etching gas (fourth process gas) used in step S1 and the etching gas (third process gas) used in step S3 may be the same or may be different.

Figure 4E:
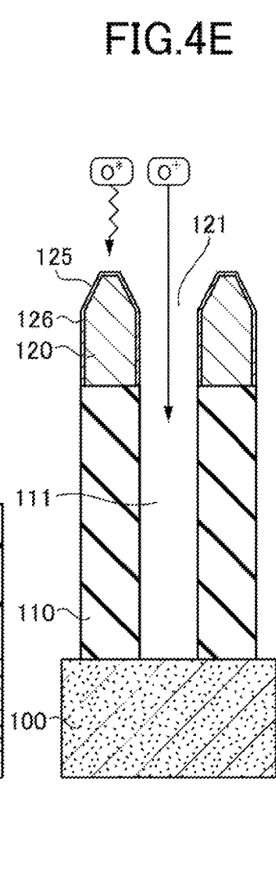

Thus, as illustrated in FIG. 4E, the organic film 110 is plasma etched using the silicon-containing film 120 as a mask, and the depth of the opening 111 formed in the organic film 110 becomes deeper. The silicon-containing film 120 is also etched. As the shoulder of the silicon-containing film 120 is abraded earlier, a slope 125 is formed. In addition, an oxide film 126, which is an $SiO_2$ film, is formed on the surface of the silicon-containing film 120.

In step S4, it is determined whether or not the organic film etching step is performed a predetermined number of times. The predetermined number of times may be, for example, the number of times considered as needed for the opening 111 of the organic film 110 to reach a target etching depth (e.g., reached the underlayer film 100). If the organic film etching step has not been performed the predetermined number of times (NO in step S4), the process of the controller 30 returns to step S2, and the mask rectification step of rectangulating the silicon-containing film 120 used as a mask (step S2) and the organic film etching step of etching the organic film 110 (step S3) are performed repeatedly until the organic film etching step is performed the predetermined number of times. When the number of executions of the organic film etching step reaches the predetermined number of times (YES in step S4), the controller 80 terminates the process.

Through the above-described process, a pattern of the opening 111 is formed in the organic film 110. Then, the underlayer film 100 is etched using the organic film 110 as a mask.

Next, the process of etching the organic film 110 according to the present embodiment will be further described with reference to FIGS. 5A and 5B.

Figure 5A:
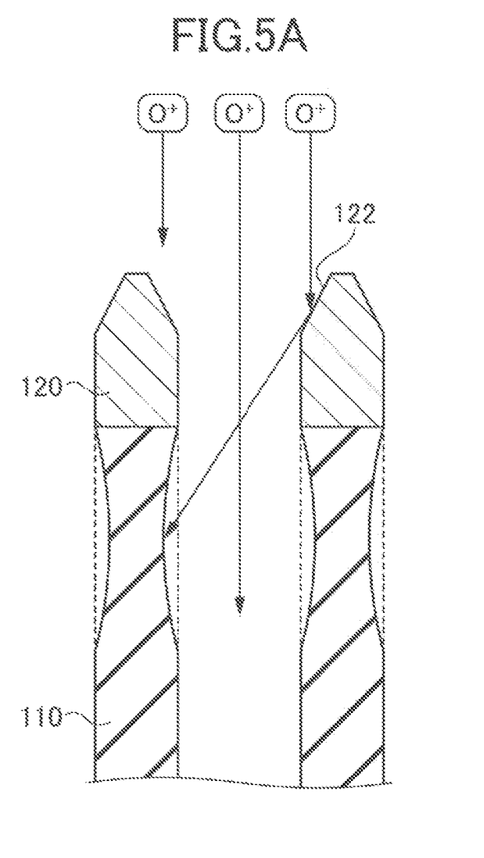
FIGS. 5A and 5B are schematic diagrams illustrating behavior of oxygen ions.

FIG. 5A is a schematic diagram illustrating behavior of oxygen ions in the case in which the slope 122 is formed at the shoulder of the silicon-containing film 120. By the second radio frequency power being applied to the lower electrode 18, oxygen ions enter perpendicular to the substrate w. At this time, part of the oxygen ions incident on the slope 122 bounce off the slope 122, and collide with the side wall of the organic film 110 by passing through the opening 121 and the opening 111, and thereby etch the side wall of the organic film 110. Therefore, the opening 111, on which a bowing is generated, is formed in the organic film 110.

Figure 5B:
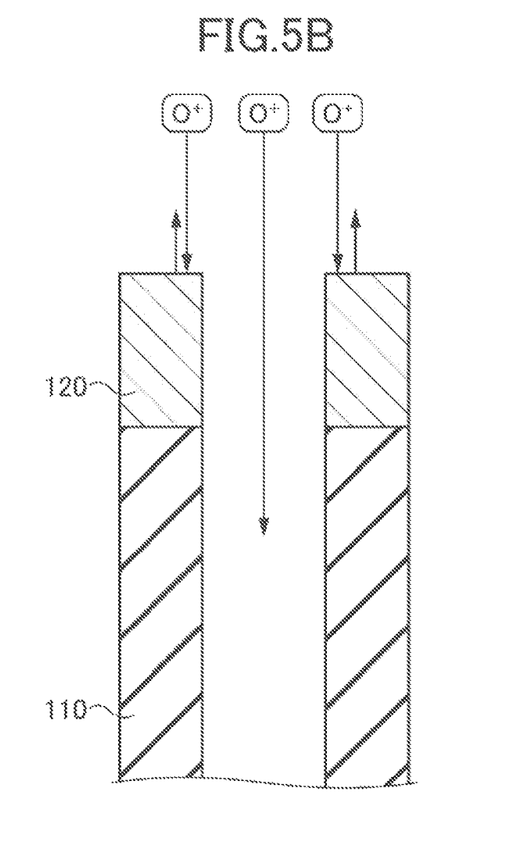

FIG. 5B is a schematic diagram explaining behavior of oxygen ions when the shoulder of the silicon-containing film 120 is rectangulated. By the second radio frequency power being applied to the lower electrode 18, oxygen ions are drawn into the substrate W. At this time, as the silicon-containing film 120 is rectangulated, it is possible to prevent oxygen ions from bouncing off the silicon-containing film 120 and colliding with the side wall of the organic film 110. Accordingly, occurrence of bowing in the organic film 110 can be prevented.

As described above, according to the process of etching the organic film 110 according to the present embodiment, because the organic film 110 is etched after the shoulder of the silicon-containing film 120 is rectified (rectangulated), it is possible to prevent ions that have rebounded from colliding with the side wall of the organic film 110, and occurrence of bowing in the opening 111 of the organic film 110 can be suppressed. Accordingly, it is possible to suppress occurrence of an etching shape defect of the organic film 110.

In addition, because occurrence of an etching shape defect of the opening 111 of the organic film 110 can be suppressed, when the underlayer film 100 is etched using the organic film 110 as a mask, it is possible to suppress occurrence of an etching shape defect of the underlayer film 100.

Figure 6:
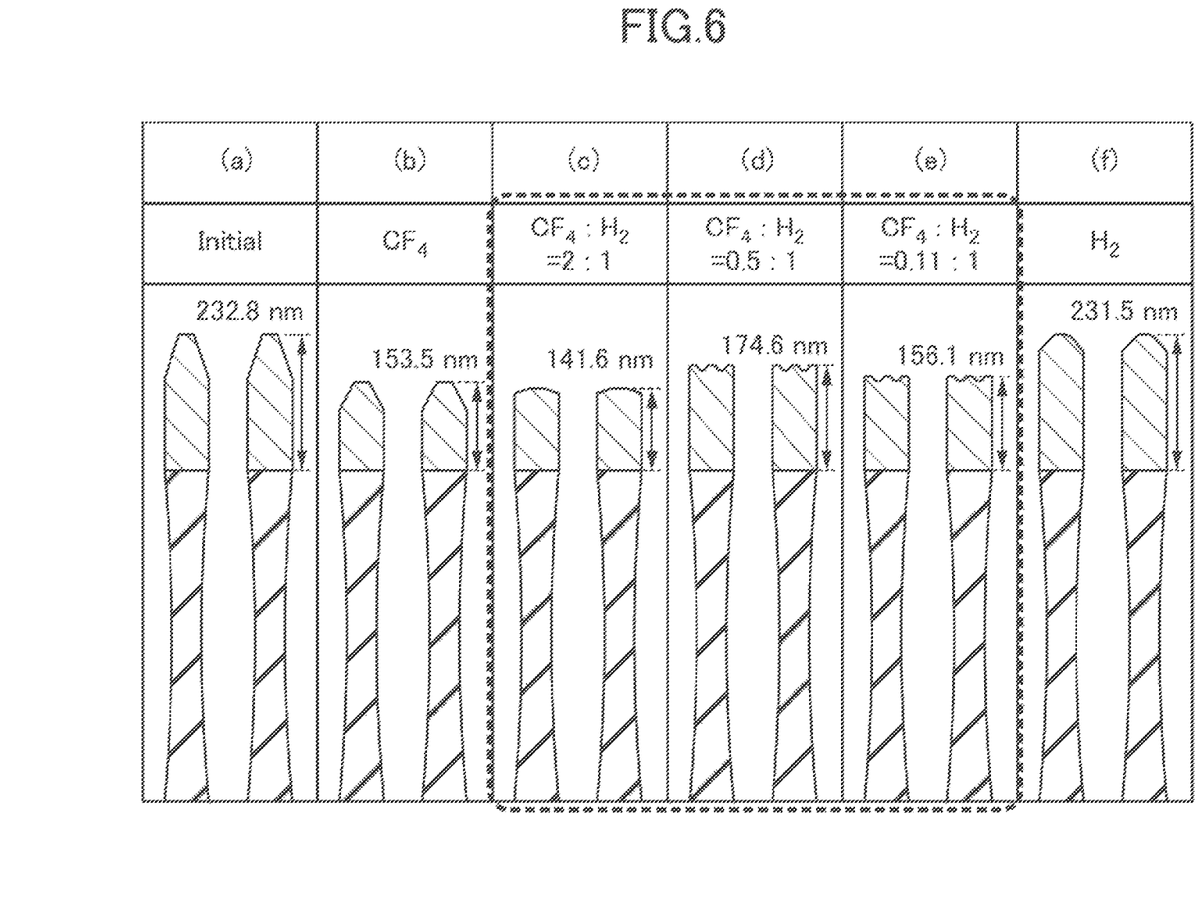
FIG. 6 is a diagram illustrating a relationship between a flow rate ratio of first and second process gases and a shape of a silicon-containing film.

FIG. 6 is a diagram illustrating a relationship between the flow rate ratio of the first and second process gases and the shape of the silicon-containing film 120. In the example of FIG. 6, column (a) (initial) illustrates the shape of the silicon-containing film 120 before performing the mask rectification step. Column (b) illustrates a first reference example, in which only $CF_4$ gas was supplied. Column (c) illustrates a case in which $CF_4$ gas and $H_2$ gas were supplied at a flow ratio of $CF_4$ to $H_2$ being 2:1. Column (d) illustrates the case in which $CF_4$ gas and $H_2$ gas were supplied at a flow ratio of $CF_4$ to $H_2$ gas being 0.5:1. Column (e) illustrates a case in which $CF_4$ gas and gas were supplied at a flow ratio of $CF_4$ to $H_2$ gas being 0.11:1. Column (f) illustrates a second reference example, in which only $H_2$ gas was supplied.

As illustrated in the column (a) (Initial) of FIG. 6, before the mask rectification step, a slope is formed on the shoulder of the silicon-containing film 120.

As illustrated in the column (b) of FIG. 6, in a case in which only $CF_4$ gas was supplied, the thickness of the silicon-containing film 120 is reduced by plasma etching. Also, the upper surface of the silicon-containing film 120 is not made to be flat. In other words, the silicon-containing film 120 is not rectangulated, and a slope is formed at the shoulder of the silicon-containing film 120.

In addition, as illustrated in the column (f) of FIG. 6, in a case in which only H; gas was supplied, the shape of the silicon-containing film 120 is not changed, and the upper surface of the silicon-containing film 120 is not made to be flat. In other words, the silicon-containing film 120 is not rectangulated, and a slope is formed at the shoulder of the silicon-containing film 120.

Furthermore, as illustrated in the columns (c) to (e) of FIG. 6, it was confirmed that the shoulder of the silicon-containing film 120 can be suitably rectangulated by supplying $CF_4$ gas and gas at the flow ratio of $CF_4$ gas to $H_2$ gas within a range of 0.11 to 2.

Although the embodiments of the plasma processing apparatus and the plasma processing method have been described, the present disclosure is not limited to the above-described embodiments, and various modifications and enhancements can be made within the scope of the gist of the present disclosure as claimed.

What is claimed is:

1. A method of etching an organic film by a plasma through a mask having an opening, the mask being formed on the organic film and being made of a silicon-containing film, the method comprising rectifying a shape of the mask;
   wherein the rectifying of the shape of the mask includes
      changing a chemical composition of a side wall of the opening of the mask to a different chemical composition, without etching the side wall, and
      etching an upper surface of the mask, and
   wherein the side wall of the opening of the mask is changed to SiC, in the changing of the chemical composition of the side wall of the opening of the mask.

2. The method according to claim 1, wherein the changing of the chemical composition of the side wall of the opening of the mask includes performing plasma processing using a first process gas including hydrogen-containing gas.

3. The method according to claim 2, wherein the changing of the chemical composition of the side wall of the opening of the mask includes
   etching the organic film using a plasma formed from the first process gas, and
   changing the chemical composition of the side wall using reaction products generated by the etching of the organic film using the plasma formed from the first process gas.

4. The method according to claim 1, wherein in the etching of the upper surface of the mask, an etch rate of SiC is smaller than an etch rate of a part of the silicon-containing film that is not changed to SiC.

5. The method according to claim 4, wherein the etching of the upper surface of the mask includes performing plasma processing using a second process gas including halogen-containing gas.

6. The method according to claim 5, wherein the second process gas includes hydrogen-containing gas.

7. The method according to claim 1, wherein the etching of the upper surface of the mask includes performing plasma processing using a second process gas including halogen-containing gas.

8. The method according to claim 1, wherein the etching of the upper surface of the mask is performed after the changing of the chemical composition of the side wall of the opening of the mask.

9. The method according to claim 1, further comprising:
etching the organic film using a plasma formed from a third process gas containing oxygen, after the rectifying of the shape of the mask.

10. The method according to claim 9, wherein the rectifying of the shape of the mask and the etching of the organic film using the plasma formed from the third process gas are repeated at least once.

11. The method according to claim 9, further including
oxidizing a surface of the mask by using a plasma formed from a fourth process gas containing oxygen, before the rectifying of the shape of the mask.

12. The method according to claim 11, wherein the third process gas is a same gas as the fourth process gas.

13. The method according to claim 11, wherein the third process gas is different from the fourth process gas.

14. The method according to claim 11, wherein the oxidizing of the surface of the mask includes etching the organic film by using the plasma formed from the fourth process gas.

15. The method according to claim 14, wherein, in the oxidizing of the surface of the mask, the plasma formed from the fourth process gas abrades a shoulder of the opening of the mask.

16. The method according to claim 9, wherein the third process gas includes at least one gas selected from a group consisting of $O_2$ gas, CO gas, $CO_2$ gas, $O_3$ gas), COS gas, $Cl_2$ gas, and HBr gas.

17. The method according to claim 1, wherein the changing of the chemical composition of the side wall of the opening of the mask includes performing plasma processing using a first process gas, and the etching of the upper surface of the mask includes performing plasma processing using a second process gas,
wherein the first process gas includes at least one hydrogen containing gas selected from a group consisting of $H_2$ gas, $CH_4$ gas, $CH_3F$ gas, $CH_2F_2$ gas, and $H_2O$ gas, and the second process gas includes at least one halogen containing gas selected from a group consisting of $CF_4$ gas, $CHF_3$ gas, $C_4F_8$ gas, $C_4F_6$ gas, $NF_3$ gas, HBr gas, and $Cl_2$ gas.

18. A method of etching an organic film by a plasma through a mask having an opening, the mask being formed on the organic film and being made of a silicon-containing film, the method comprising rectifying a shape of the mask;
wherein the rectifying of the shape of the mask includes
changing a chemical composition of a side wall of the opening of the mask to a different chemical composition, without etching the side wall, and
etching an upper surface of the mask,
wherein the changing of the chemical composition of the side wall of the opening of the mask and the etching of the upper surface of the mask are performed simultaneously.

19. A method of etching an organic film by a plasma through a mask having an opening, the mask being formed on the organic film and being made of a silicon-containing film, the method comprising rectifying a shape of the mask;
wherein the rectifying of the shape of the mask includes
refining a side wall of the opening of the mask, and
etching an upper surface of the mask,
wherein the refining of the side wall of the opening of the mask includes
etching the organic film using a plasma formed from a process gas, and
refining the side wall using reaction products generated by the etching of the organic film using the plasma formed from the process gas.

* * * * *